United States Patent
Raghunathan et al.

(10) Patent No.: US 11,322,217 B2
(45) Date of Patent: May 3, 2022

(54) TRACK AND HOLD CIRCUITS WITH TRANSFORMER COUPLED BOOTSTRAP SWITCH

(71) Applicant: Texas Instruments Incorporated, Dallas, TX (US)

(72) Inventors: Ashwin Raghunathan, San Mateo, CA (US); Marco Corsi, Scotts Valley, CA (US); Baher Haroun, Allen, TX (US); Seyed Miaad Seyed Aliroteh, Milpitas, CA (US); Swaminathan Sankaran, Allen, TX (US); Robert Floyd Payne, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/003,185

(22) Filed: Aug. 26, 2020

(65) Prior Publication Data

US 2021/0065830 A1    Mar. 4, 2021

Related U.S. Application Data

(60) Provisional application No. 62/892,399, filed on Aug. 27, 2019.

(51) Int. Cl.
| | | |
|---|---|---|
| *G11C 27/00* | (2006.01) | |
| *G11C 27/02* | (2006.01) | |
| *H03K 17/06* | (2006.01) | |
| *H03M 1/12* | (2006.01) | |
| *H03M 1/06* | (2006.01) | |

(52) U.S. Cl.
CPC ......... *G11C 27/026* (2013.01); *H03M 1/0624* (2013.01); *H03M 1/1245* (2013.01)

(58) Field of Classification Search
None
See application file for complete search history.

(56) References Cited

U.S. PATENT DOCUMENTS

| | | | | |
|---|---|---|---|---|
| 3,136,960 A | * | 6/1964 | Ausfresser | H03K 7/08 332/110 |
| 3,610,963 A | * | 10/1971 | Higgins | H03K 17/64 327/191 |
| 3,914,626 A | * | 10/1975 | Peterson | H02M 7/539 327/91 |
| 5,172,034 A | * | 12/1992 | Brinkerhoff | H05B 41/3925 315/219 |
| 6,072,355 A | | 6/2000 | Bledsoe | |

(Continued)

OTHER PUBLICATIONS

Search Report for PCT Application No. PCT/US20/48088, dated Nov. 5, 2020, 1 page.

*Primary Examiner* — Kenneth B Wells
(74) *Attorney, Agent, or Firm* — Michael A. Davis, Jr.; Charles A. Brill; Frank D. Cimino

(57) ABSTRACT

A track and hold circuit includes a signal input terminal, a clock input terminal, an output terminal, a transistor, and a bootstrapping circuit with a transformer. The transistor includes a source, a drain, and a gate, where the source is coupled to the signal input terminal, and the drain is coupled to the output terminal. The transformer includes a primary winding coupled to the clock input terminal, and a secondary winding. The secondary winding is coupled between the source and the gate to control a gate-source voltage of the transistor.

20 Claims, 8 Drawing Sheets

(56) References Cited

U.S. PATENT DOCUMENTS

| | | |
|---|---|---|
| 6,265,911 B1 | 7/2001 | Nairn |
| 8,664,979 B2 | 3/2014 | Doris et al. |
| 8,994,564 B2 | 3/2015 | Hurrell et al. |
| 2009/0039923 A1 | 2/2009 | Corsi et al. |
| 2009/0073016 A1 | 3/2009 | Fattaruso et al. |
| 2009/0219059 A1 | 9/2009 | Corsi et al. |
| 2009/0219060 A1 | 9/2009 | Payne et al. |
| 2011/0043257 A1 | 2/2011 | Corsi et al. |
| 2012/0044004 A1 | 2/2012 | Payne et al. |
| 2013/0015990 A1 | 1/2013 | Payne et al. |
| 2013/0038480 A1 | 2/2013 | Corsi et al. |

\* cited by examiner

TRACK AND HOLD CIRCUITS WITH TRANSFORMER COUPLED BOOTSTRAP SWITCH

CROSS-REFERENCE TO RELATED APPLICATION

This application claims priority to, and the benefit of, U.S. provisional patent application No. 62/892,399, entitled "TRANSFORMER COUPLED BOOTSTRAP SWITCH FOR HIGH SPEED TRACK AND HOLD", and filed on Aug. 27, 2019, the entirety of which is hereby incorporated by reference.

BACKGROUND

Track and hold or sample and hold circuits are used to sample an analog signal, such as a voltage, at discrete times, for example, to provide a stable input to an analog to digital converter (ADC). A sampling transistor is used as a switch to selectively couple an input signal to the track and hold output for sampling. However, the analog input signal level can affect the gate-source voltage of the sampling transistor and lead to distortion caused by input-dependent on-state resistance (e.g., drain-source on-state resistance RDSON) of the sampling transistor. Bootstrap circuits can improve switch linearity in analog track and hold circuits. The bootstrap circuit adds circuitry to attempt to make the sampling transistor on-state resistance independent of the input signal amplitude to minimize the switch on-resistance variation in the presence of large input and output voltage swings. However, bootstrap circuits using switches and capacitors are difficult to scale to higher sampling frequencies due to limitations of parasitic capacitances. In addition, more advanced bootstrap circuits use large numbers of transistors and thus are inefficient and require routing and switching of complementary phases of a sample clock signal.

SUMMARY

Described examples include electronic devices, track and hold circuits and bootstrap circuits having a transformer to control the gate-source voltage of the transistor used to sample an input signal. The transistor includes a source coupled to a signal input terminal and a drain coupled to an output terminal. The transformer has a primary winding coupled to a clock input terminal, and a secondary winding coupled between the source and gate of the transistor.

DETAILED DESCRIPTION

Figure 1:
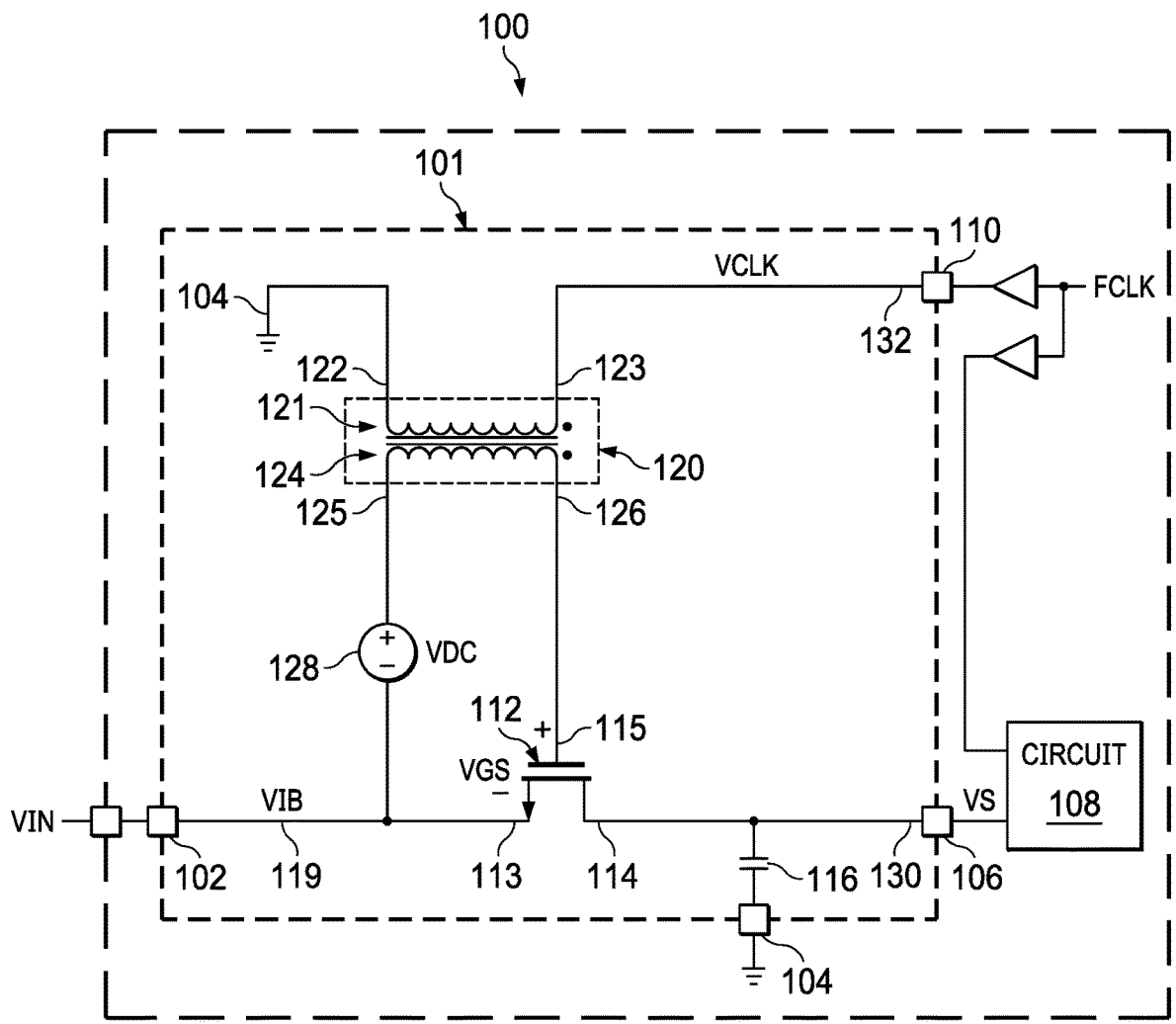
FIG. 1 is a schematic diagram of a track and hold circuit with a bootstrap circuit having a transformer.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
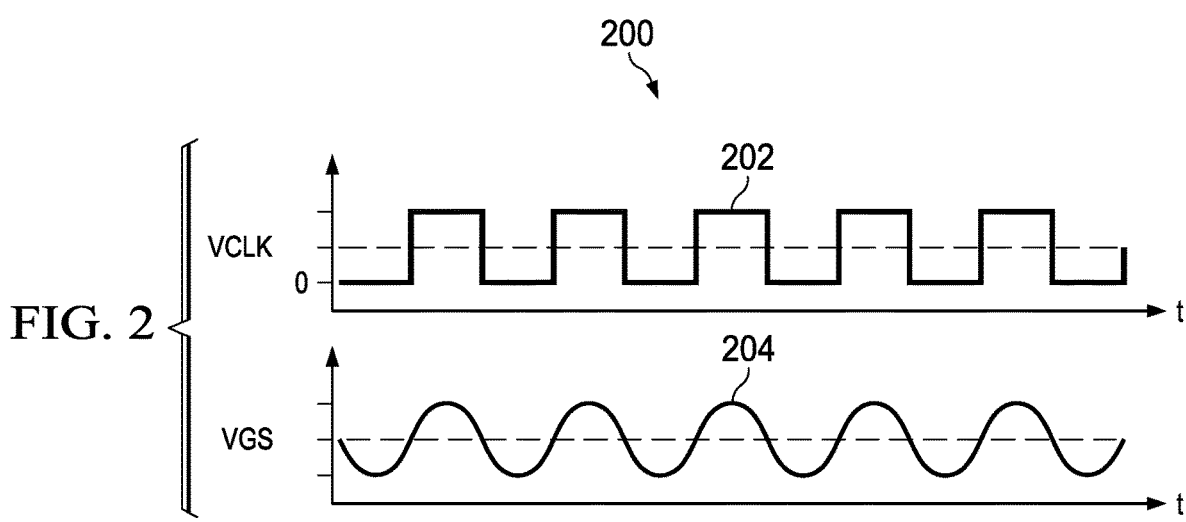
FIG. 2 is a graph of clock and gate-source voltage signals in the track and hold circuit of FIG. 1.
Figure 3:
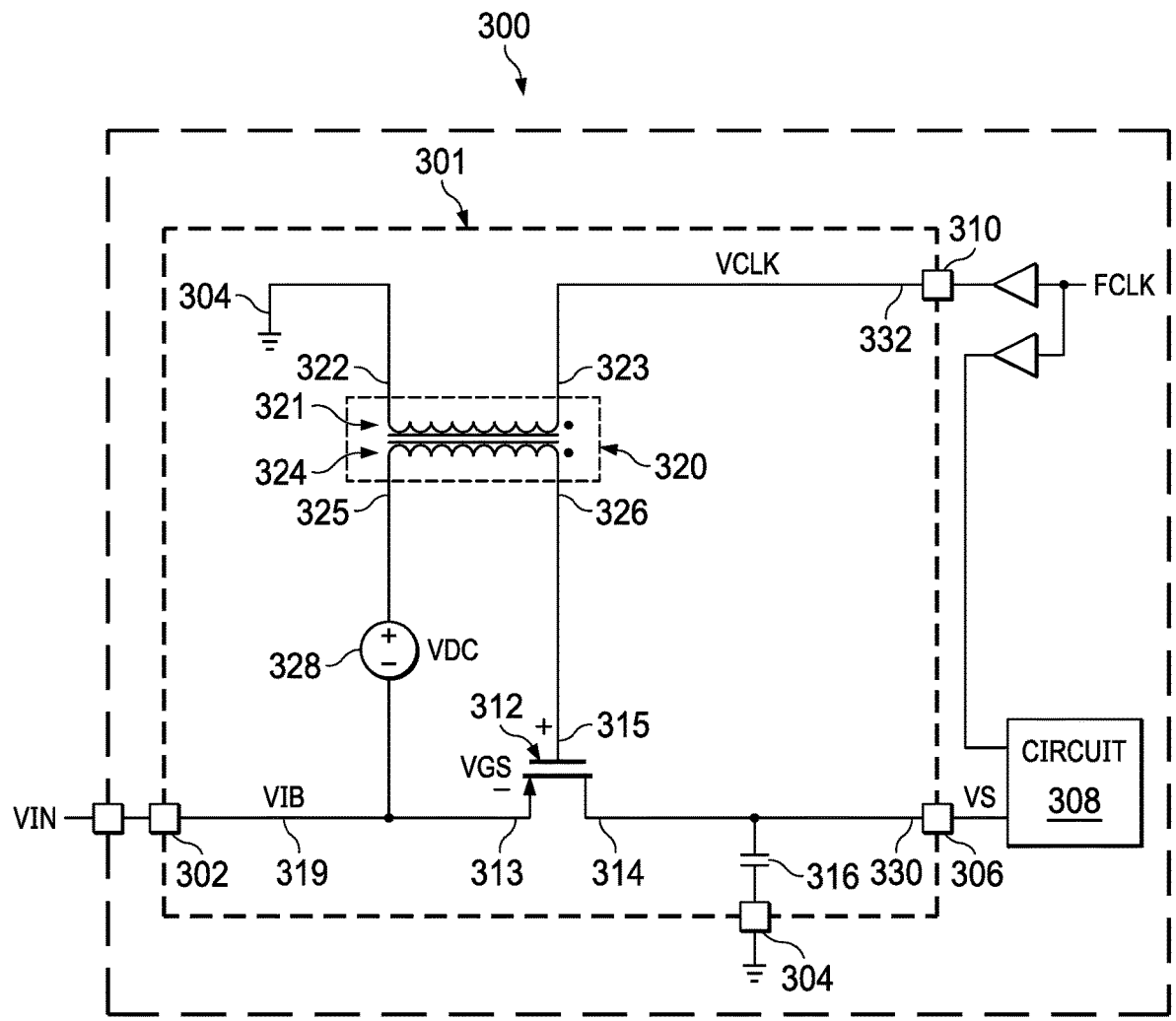
FIG. 3 is a schematic diagram of another example track and hold circuit with a bootstrap circuit having a transformer.

Referring initially to FIGS. 1-3, FIG. 1 shows an example track and hold circuit 100 with a bootstrap circuit having a transformer and FIG. 2 shows clock and gate-source voltage signals in the track and hold circuit 100 of FIG. 1. In one example, the track and hold circuit 100 is included in an electronic device 101, such as an integrated circuit having a semiconductor die with the circuitry that forms the track and hold circuit 100, and includes externally accessible terminals for interconnection to other circuits, for example of a host printed circuit board (not shown). In one example electronic device implementation, an integrated circuit device includes the track and hold circuit 100 along with other circuits. In another example electronic device implementation, the track and hold circuit 100 is provided as a stand-alone integrated circuit or other packaged electronic device 101 as shown in FIG. 1. The electronic device 101 and the track and hold circuit 100 thereof in this example includes an input terminal 102 adapted to be coupled to receive a voltage input signal VIN, a reference terminal 104 adapted to be coupled to a ground or other reference voltage node, an output terminal 106 that provides a sampled voltage output signal VS to an analog-to-digital converter or other receiving circuit 108. The electronic device further includes a clock input terminal 110 adapted to be coupled to receive a clock signal VCLK directly or indirectly from a processor or other clock signal source. In one example, the clock signal source includes an input adapted to receive a clock input signal FCLK from an external clock, a first buffer that provides the clock signal VCLK to the clock input terminal 110, as well as a second buffer that provides a clock signal to the receiving circuit 108.

In one implementation, the electronic device 101, the clock signal source and the circuit 108 are soldered to a printed circuit board that provides traces or other electrically conductive connections from the output terminal 106 to an analog input terminal of the circuit 108, and connections from the clock input terminal 110 to the clock signal source. In another implementation, an electronic device includes the track and hold circuit 100, the clock signal source and the circuit 108 in a single integrated circuit, for example, a microcontroller with an included processor operating as the clock signal source and ADC converter or other receiving circuit 108 that converts the sampled voltage output signal VS and provides digital conversion values to the processor. In these examples, moreover, the clock signal source generates the clock signal VCLK for operation of the track and hold circuit 100.

The track and hold circuit 100 includes a transistor 112 for sampling an analog voltage signal VIB according to the clock signal VCLK. The transistor 112 in this implementation is an n-channel field effect transistor (FET) that includes a source 113, a drain 114, and a gate 115. The transistor drain 114 is coupled to the output terminal 106. The track and hold circuit 100 also includes a capacitor 116 with a first terminal coupled to the output terminal 106 and a second terminal coupled to the reference terminal 104.

The track and hold circuit 100 in one example includes a buffer with a buffer input coupled to the input terminal 102 to receive the input voltage signal VIN, and a buffer output that provides a buffered input voltage signal VIB at a signal input terminal 119. In the illustrated example, the transistor source 113 is coupled to the signal input terminal 119, and the drain 114 is coupled to the output terminal 106. When the transistor 112 is turned on to sample the buffered input voltage signal VIB, the transistor 112 forms a connection to pass the signal VIB to the capacitor 116, which provides the sampled output voltage signal VS to the circuit 108. In another example, the buffer is omitted and the signal input terminal 119 is coupled directly to the input terminal 102 as shown in FIG. 1.

The track and hold circuit 100 also includes a bootstrap circuit with a transformer 120. The transformer 120 has a primary winding 121 with a first end 122 and a second end 123, as well as a secondary winding 124 with a first end 125 and a second end 126. The track and hold circuit 100 in this example includes a voltage source 128 having a first terminal (e.g., labeled "+" in FIG. 1) and a second terminal (e.g., labeled "−"). The first terminal of the voltage source 128 is coupled to the first end 125 of the secondary winding 124. The second terminal of the voltage source is coupled to the signal input terminal 119. The first end 125 of the secondary winding 124 is coupled to the first terminal of the voltage source 128, and the second end 126 of the secondary winding 124 is coupled to the gate 115. In operation, the first terminal of the voltage source 128 provides a DC bias voltage VDC to the secondary winding to facilitate controlled application of the gate-source voltage VGS to the transistor 112 in alternating first and second states above and below the threshold voltage of the transistor 112 for controlled actuation (e.g., turning on and turning off) of the transistor 112.

The primary winding 121 is coupled to the clock input terminal 110. In the illustrated example, the first end 122 of the primary winding 121 is coupled directly to the reference terminal 104, and the second end 123 of the primary winding 121 is coupled directly to the clock input terminal 110. In other implementations (e.g., FIG. 6 below) a transformer primary winding is coupled indirectly to the clock input terminal 110 and/or to the reference terminal 104 via further bootstrap circuitry as described further below. In the example of FIG. 1, the secondary winding 124 is coupled in series with the voltage source 128 between the source 113 and the gate 115 of the transistor 112 to control the gate-source voltage VGS of the transistor 112 in response to different states or edges of the clock signal VCLK received at the clock input terminal 110. In the illustrated example, the transistor drain 114 and the first terminal of the capacitor 116 are coupled together to form a track and hold signal output 130 coupled to the output terminal 106. In addition, the second end 123 of the transformer primary winding 121 forms a clock input 132 coupled to the clock input terminal 110.

FIG. 2 shows a graph 200 of clock and gate-source voltage signals as a function of time in operation of the example track and hold circuit 100 of FIG. 1. A curve 202 shows the received clock signal VCLK, and a curve 204 shows the gate-source voltage signal VGS of the transistor 112. The clock signal VCLK (curve 202) has a low level at or near 0 V (e.g., the ground voltage level of the reference terminal 104), and a high level corresponding to a supply voltage of the clock signal source. The transformer 120 provides a bootstrap circuit that controls the gate source voltage signal VGS independent of the amplitude of the buffered input voltage signal VIB (and independent of the amplitude of the input voltage signal VIN, whether the buffer 118 is included or omitted). This bootstrap circuit operation advantageously mitigates distortion and other choose one and allows use of the track and hold circuit 100 for high accuracy analog to digital conversion even for low input voltage signal amplitudes, as well as input signals having wide amplitude ranges. Moreover, the track and hold circuit 100 is power efficient, scalable to operation at high sample clock frequencies, and occupies animal circuit area, particularly compared with advanced high-frequency track and hold bootstrap circuitry. In addition, the voltage source 128 facilitates improved sample transistor switching reliability and allows adjustment of the DC bias voltage VDC to accommodate threshold voltage parameters of a particular sampling transistor 112.

FIG. 3 shows another example track and hold circuit 300 with a bootstrap circuit having a transformer. The track and hold circuit 300 in this example uses a p-channel FET transistor, and generally operates in similar fashion to the track and hold circuit 100 of FIG. 1. In one example, the track and hold circuit 300 is included in an electronic device 301, such as an integrated circuit, which may, but need not, include other circuitry. The track and hold circuit 300 includes an input terminal 302 adapted to be coupled to receive a voltage input signal VIN, a reference terminal 304 adapted to be coupled to a ground or other reference voltage node, an output terminal 306 that provides a sampled voltage output signal VS to an analog-to-digital converter (ADC) 308, and a clock input terminal 310 adapted to be coupled to receive a clock signal VCLK from a clock signal source. In one example, the clock signal source includes an input adapted to receive a clock input signal FCLK from an external clock, a first buffer that provides the clock signal VCLK to the clock input terminal 310, as well as a second buffer that provides a clock signal to the ADC 308.

In one implementation, the electronic device 301, the clock signal source and the circuit 308 are soldered to a printed circuit board that provides traces or other electrically conductive connections from the output terminal 306 to an analog input terminal of the circuit 308, and connections from the clock input terminal 310 to the clock signal source. In another implementation, an electronic device includes the track and hold circuit 300, the clock signal source and the circuit 308 in a single integrated circuit, for example, a microcontroller with an included processor operating as the clock signal source and ADC converter or other receiving circuit 308 that converts the sampled voltage output signal VS and provides digital conversion values to the processor.

In these examples, moreover, the clock signal source generates the clock signal VCLK for operation of the track and hold circuit 300.

The track and hold circuit 300 includes a p-channel transistor 312 for sampling an analog voltage signal VIB according to the clock signal VCLK. The transistor 312 in this implementation includes a source 313, a drain 314, and a gate 315. The transistor drain 314 is coupled to the output terminal 306. The track and hold circuit 300 also includes a capacitor 316 with a first terminal coupled to the output terminal 306 and a second terminal coupled to the reference terminal 304.

The track and hold circuit 300 in one example includes a buffer with a buffer input coupled to the input terminal 302 to receive the input voltage signal VIN, and a buffer output that provides a buffered input voltage signal VIB at a signal input terminal 319. In the illustrated example, the transistor source 313 is coupled to the signal input terminal 319, and the drain 314 is coupled to the output terminal 306. When the transistor 312 is turned on to sample the buffered input voltage signal VIB, the transistor 312 forms a connection to pass the signal VIB to the capacitor 316, which provides the sampled output voltage signal VS to the circuit 308. In another example, the buffer is omitted and the signal input terminal 319 is coupled directly to the input terminal 302 as shown in FIG. 3.

The track and hold circuit 300 also includes a bootstrap circuit with a transformer 320. The transformer 320 has a primary winding 321 with a first end 322 and a second end 323, as well as a secondary winding 324 with a first end 325 and a second end 326. The track and hold circuit 300 in this example includes a voltage source 328 having a first terminal (e.g., labeled "+" in FIG. 3) and a second terminal (e.g., labeled "−"). The first terminal of the voltage source 328 is coupled to the first end 325 of the secondary winding 324. The second terminal of the voltage source is coupled to the signal input terminal 319. The first end 325 of the secondary winding 324 is coupled to the first terminal of the voltage source 328, and the second end 326 of the secondary winding 324 is coupled to the gate 315. In operation, the first terminal of the voltage source 328 provides a DC bias voltage VDC to the secondary winding to facilitate controlled application of the gate-source voltage VGS to the transistor 312 in alternating first and second states above and below the threshold voltage of the transistor 312 for controlled actuation (e.g., turning on and turning off) of the transistor 312.

The primary winding 321 is coupled to the clock input terminal 310. In the illustrated example, the first end 322 of the primary winding 321 is coupled directly to the reference terminal 304, and the second end 323 of the primary winding 321 is coupled directly to the clock input terminal 310. In other implementations (e.g., FIG. 6 below) a transformer primary winding is coupled indirectly to the clock input terminal 310 and/or to the reference terminal 304 via further bootstrap circuitry as described further below. In the example of FIG. 3, the secondary winding 324 is coupled in series with the voltage source 328 between the source 313 and the gate 315 of the transistor 312 to control the gate-source voltage VGS of the transistor 312 in response to different states or edges of the clock signal VCLK received at the clock input terminal 310. In the illustrated example, the transistor drain 314 and the first terminal of the capacitor 316 are coupled together to form a track and hold signal output 330 coupled to the output terminal 306. In addition, the second end 323 of the transformer primary winding 321 forms a clock input 332 coupled to the clock input terminal 310.

The transformer 320 in this example also provides a bootstrap circuit that controls the gate source voltage signal VGS independent of the amplitude of the buffered input voltage signal VIB (and independent of the amplitude of the input voltage signal VIN, whether the buffer 318 is included or omitted). This bootstrap circuit operation advantageously mitigates distortion and other choose one and allows use of the track and hold circuit 300 for high accuracy analog to digital conversion even for low input voltage signal amplitudes, as well as input signals having wide amplitude ranges. Moreover, the track and hold circuit 300 is power efficient, scalable to operation at high sample clock frequencies, and occupies animal circuit area, particularly compared with advanced high-frequency track and hold bootstrap circuitry.

Figure 4:
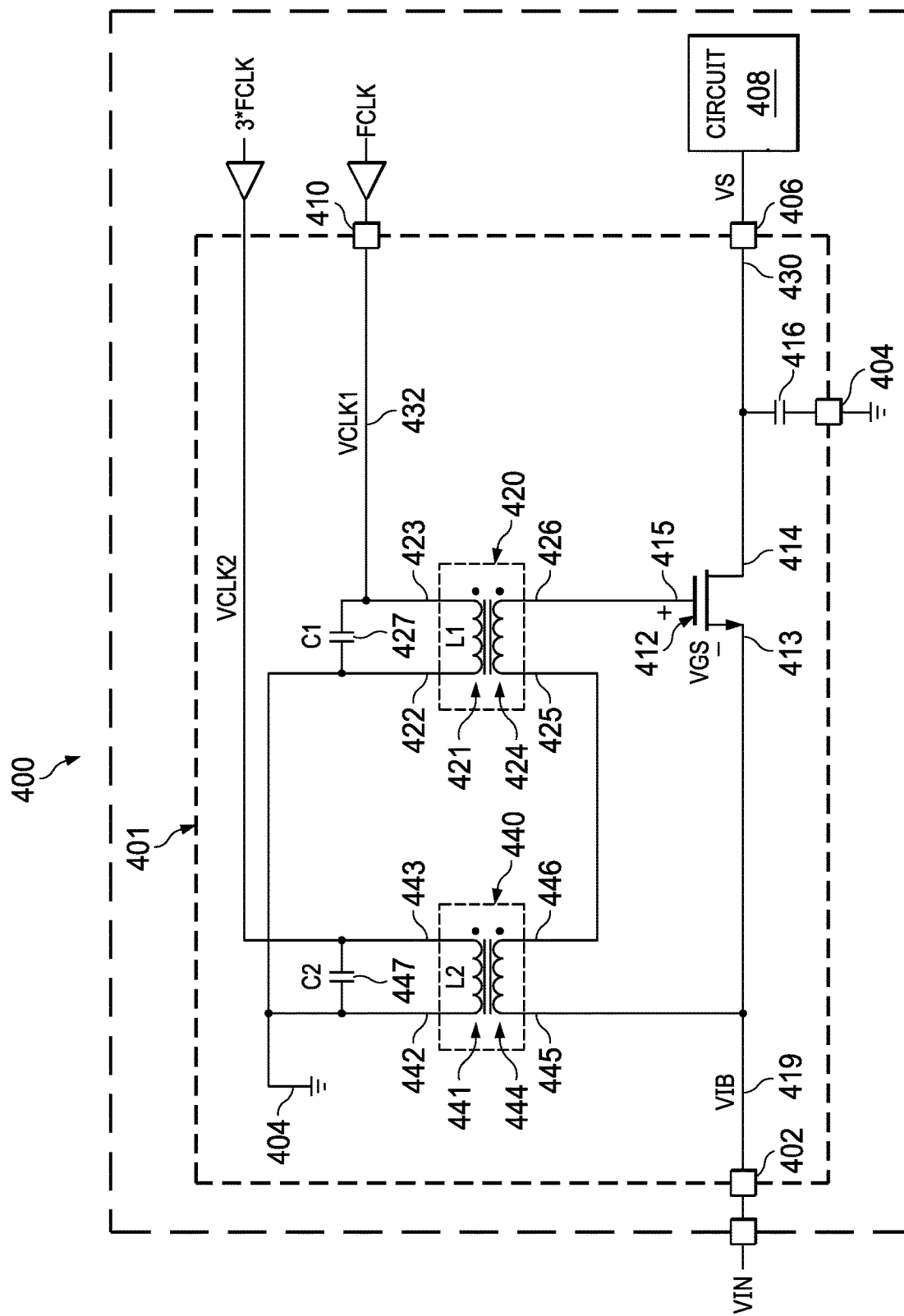
FIG. 4 is a schematic diagram of another example track and hold circuit with a bootstrap circuit having two transformers.
Figure 5:
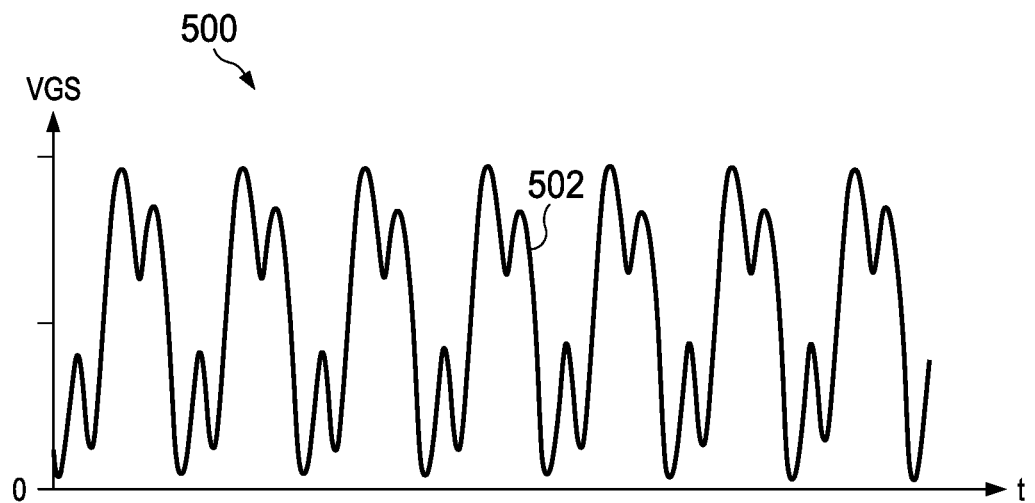
FIG. 5 is a graph of gate-source voltage signals in the track and hold circuit of FIG. 4.

Referring now to FIGS. 4 and 5, FIG. 4 shows another example track and hold circuit 400 with a bootstrap circuit having two transformers. FIG. 5 shows a graph of gate-source voltage signals in the track and hold circuit of FIG. 4. The track and hold circuit 400 in this example uses harmonic wave shaping via resident circuits associated with corresponding primary windings coupled in parallel with one another, as well as series connected secondary windings coupled between the gate and source of the track and hold transistor. Specific implementations provide tuned circuitry to make the effective clock signal more rectangular, and improve spurious free dynamic range (SFDR), particularly at high frequencies (e.g., third and fourth Nyquist zones). In the illustrated example, the bootstrap circuitry uses wave shaping to add a third harmonic to the clock waveform, although other implementations are possible that introduce different odd harmonics and/or multiple odd harmonics to the clock waveform to facilitate increased SFDR. The resident circuits can be tuned in specific implementations to accommodate any desired operating clock frequency.

As with the above examples, the track and hold circuit 400 in one example is included in an electronic device 401, such as an integrated circuit, which may, but need not, include other circuitry. The track and hold circuit 400 includes an input terminal 402 adapted to be coupled to receive a voltage input signal VIN, a reference terminal 404 adapted to be coupled to a ground or other reference voltage node, an output terminal 406 that provides a sampled voltage output signal VS to a circuit 408, and a clock input terminal 410 adapted to be coupled to receive a clock signal VCLK from a clock signal source. In one example, the clock signal source includes an input adapted to receive a first clock input signal FCLK from an external clock, a first buffer that provides a first clock signal VCLK1 at the frequency of the FCLK signal to the clock input terminal 110. In this example, another clock signal source (e.g., a frequency multiplier circuit, not shown) provides a second clock signal 3 FCLK to a second buffer that provides a buffered clock signal VCLK2 at three times the frequency of the FCLK signal. In one implementation, the electronic device 401, the clock signal source and the circuit 408 are soldered to a printed circuit board that provides traces or other electrically conductive connections from the output terminal 406 to an analog input terminal of the circuit 408, and connections from the clock input terminal 410 to the clock signal source. In another implementation, an electronic device includes the track and hold circuit 400, the clock signal source and the circuit 408 in a single integrated circuit, for example, a microcontroller with an included processor operating as the clock signal source and the circuit 408 that converts the sampled voltage output signal VS and provides digital conversion values to the processor. In one example, moreover, the clock signal source generates a clock signal VCLK for operation of the track and hold circuit 400.

The track and hold circuit 400 includes a transistor 412 for sampling an analog voltage signal VIB according to the clock signal VCLK. The transistor 412 in this implementation is an n-channel field effect transistor (FET) that includes a source 413, a drain 414, and a gate 415. The transistor drain 414 is coupled to the output terminal 406. The track and hold circuit 400 also includes a capacitor 416 with a first terminal coupled to the output terminal 406 and a second terminal coupled to the reference terminal 404.

The track and hold circuit 400 in one example includes a buffer (not shown) with a buffer input coupled to the input terminal 402 to receive the input voltage signal VIN, and a buffer output that provides a buffered input voltage signal VIB at a signal input terminal 419. In the illustrated example, the transistor source 413 is coupled to the signal input terminal 419, and the drain 414 is coupled to the output terminal 406. When the transistor 412 is turned on to sample the buffered input voltage signal VIB, the transistor 412 forms a connection to pass the buffered input voltage signal VIB to the capacitor 416, which provides the sampled output voltage signal VS to the ADC 408. In another example, the buffer is omitted and the signal input terminal 419 is coupled directly to the input terminal 402.

The track and hold circuit 400 includes a wave shaping bootstrap circuit with a first transformer 420, a second transformer 440, and respective first and second resident circuits using the corresponding inductors and respective first and second capacitors 427 and 447. The first transformer 420 has a primary winding 421 with a first end 422 and a second end 423, as well as a secondary winding 424 with a first end 425 and a second end 426. The first primary winding 421 has an inductance L1. The first capacitor 427 has a first capacitance C1 and is coupled in parallel with the first primary winding 421 to form a first parallel resident circuit having a first resident frequency. The first end 422 of the first primary winding 421 is coupled directly to the reference terminal 404, and the second end 423 of the first primary winding 421 is coupled directly to the clock input terminal 410.

The second transformer 440 has a second primary winding 441 and a second secondary winding 444. The second primary winding 441 has a first end 442 coupled to the reference node 404, and a second end 443 coupled to the clock input terminal 410. The second primary winding 441 has a second inductance L2. The second capacitor 447 has a second capacitance C2 and is coupled in parallel with the second primary winding 441 to form a second resonant circuit having a second resonant frequency that is different than the first resonant frequency. In the illustrated example, the first resonant frequency is a frequency FCLK of the clock signal VCLK at the clock input terminal 410. The second resonant frequency is an odd harmonic of the first resonant frequency. In one example, the second resonant frequency is the third harmonic of the first resonant frequency (e.g., 3×FCLK). The series connection of the secondary windings 424 and 444 between the gate 415 and the source 413 of the transistor 412 provides a composite gate-source voltage VGS as the superposition of the clock frequency FCLK and the third harmonic.

In another example, the second inductance L2 and/or the second capacitance C2 are tailored to provide the second resonant frequency at a different odd harmonic of the clock frequency FCLK (e.g., fifth, seventh, etc.). In another possible implementation, a third transformer circuit is included, having a third primary winding and an associated parallel capacitor coupled between the clock input terminal 410 and the reference terminal 404, along with a third secondary winding coupled in series with the first and second secondary windings 424 and 444 between the gate 415 and the source 413 of the transistor 412. In one possible implementation, one of the resonant circuits is tuned to be approximately equal to the clock frequency FCLK, the second resonant circuit is tuned to be an odd harmonic (e.g., third harmonic) of the clock frequency, and the third resonant circuit is tuned to be a different odd harmonic (e.g., fifth harmonic) of the clock frequency.

FIG. 5 shows a graph 500 with a curve 502 that illustrates the gate-source voltage signal VGS in the track and hold circuit 400 of FIG. 4 using a first resonant circuit and a second resonant circuit tuned to the respective fundamental clock frequency FCLK and its third harmonic 3×FCLK. The superposition of the fundamental clock frequency and the third harmonic thereof provides a gate-source voltage signal VGS to the transistor 412, which facilitates improved SFDR and reduced distortion for analog-to-digital converter applications of the track and hold circuit 400. In the illustrated example, the transistor drain 414 and the first terminal of the output capacitor 416 are coupled together to form a track and hold signal output 430 coupled to the output terminal 406. In addition, the second ends 423 and 443 of the respective transformer primary windings 421 and 441 form a clock input 432 coupled to the clock input terminal 410.

Figure 8:
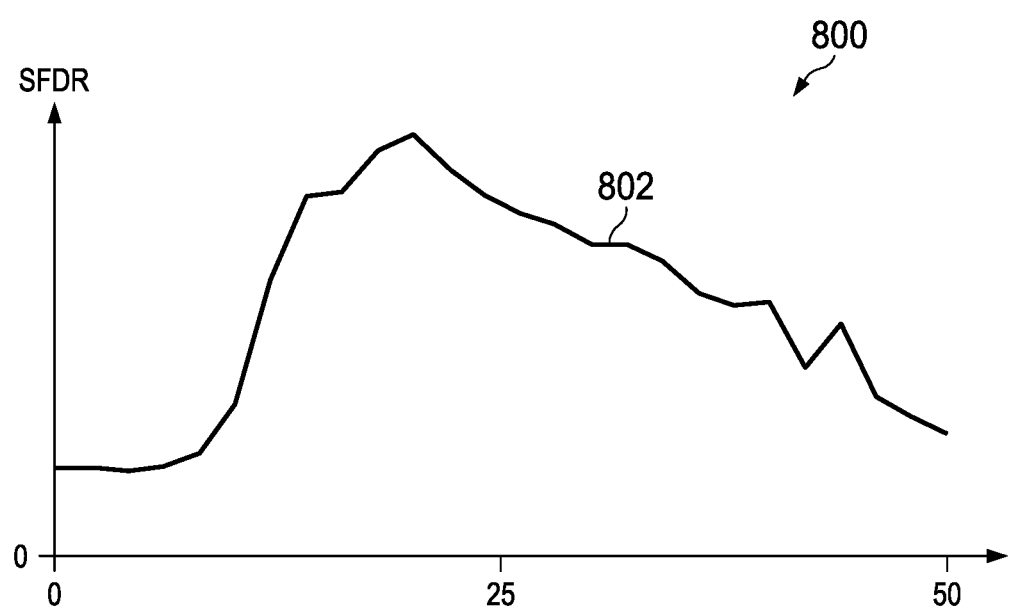
FIG. 8 is a graph of spurious free dynamic range as a function of clock signal skew in the track and hold circuit of FIG. 6.
Figure 6:
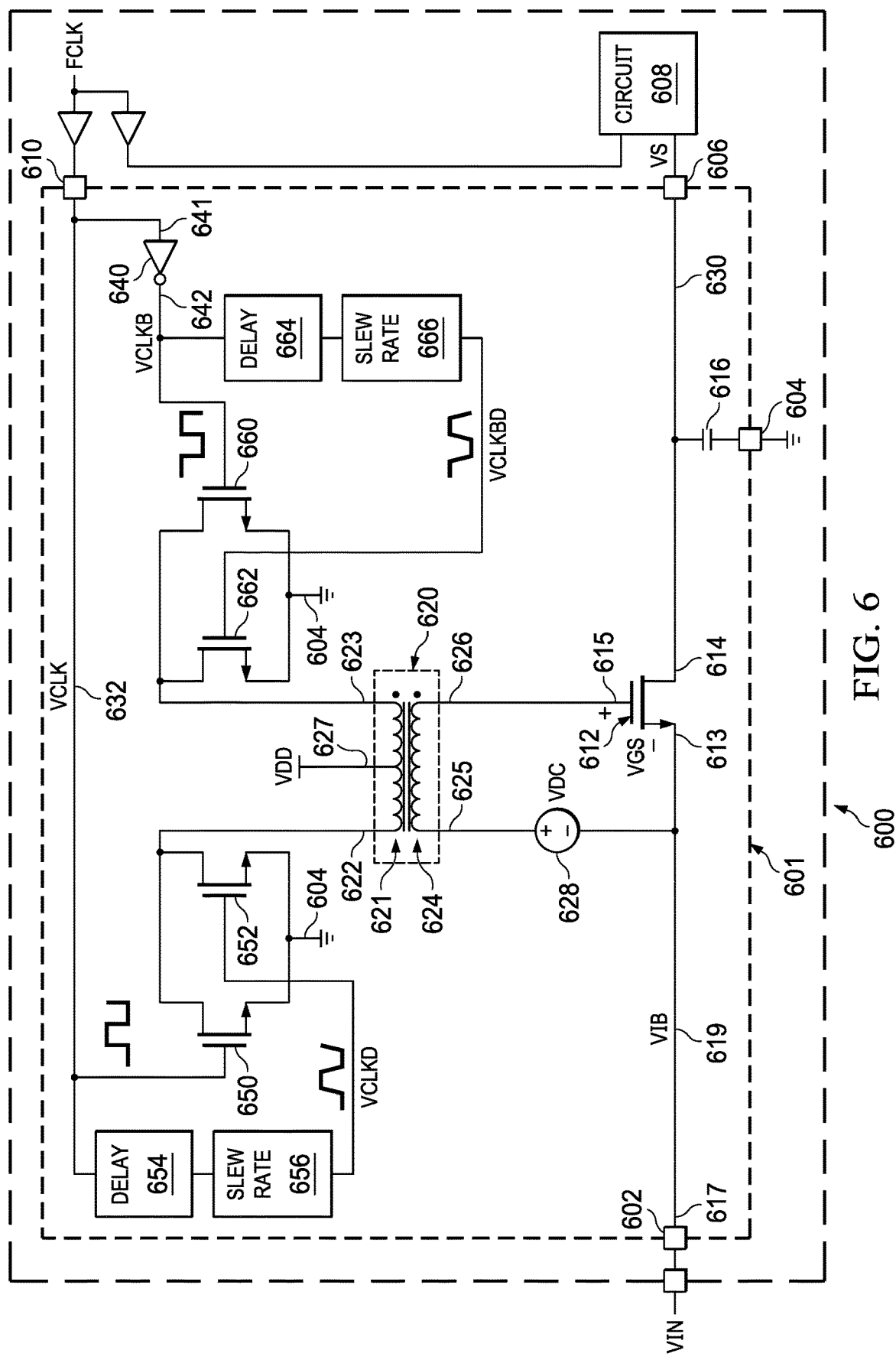
FIG. 6 is a schematic diagram of another example track and hold circuit with a bootstrap circuit having a transformer with adjustable clock signal skewing.
Figure 7:
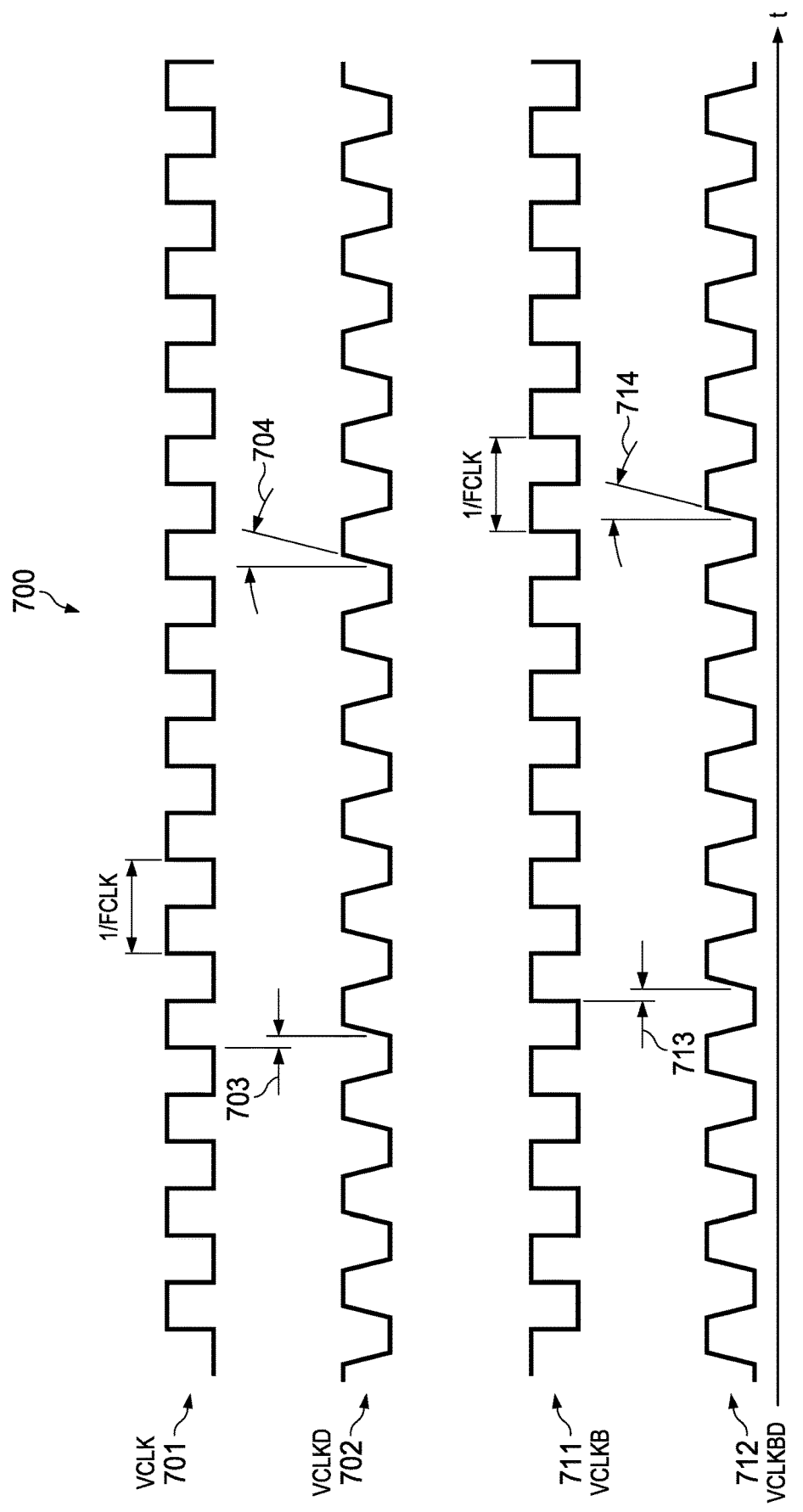
FIG. 7 is a graph of clock signals, inverted clock signals, and delayed clock signals in the track and hold circuit of FIG. 6.

FIGS. 6-8 illustrate yet another example track and hold circuit 600 having a bootstrap circuit with a transformer and adjustable primary side clock signal skewing to control the gate-source voltage VGS of the track and hold transistor with improved SFDR in low distortion performance. FIG. 6 shows the track and hold circuit 600, FIG. 7 shows example SFDR performance as a function of clock signal skew in the track and hold circuit 600, and FIG. 8 shows several example gate-source voltage signals VGS for different clock signal skew amounts in the track and hold circuit 600.

The track and hold circuit 600 in one example is included in an electronic device 601, such as an integrated circuit, which may, but need not, include other circuitry. The track and hold circuit 600 includes an input terminal 602 adapted to be coupled to receive a voltage input signal VIN, a reference terminal 604 adapted to be coupled to a ground or other reference voltage node, an output terminal 606 that provides a sampled voltage output signal VS a circuit 608, and a clock input terminal 610 adapted to be coupled to receive a clock signal VCLK from a processor or other clock signal source. In one example, the clock signal source includes an input adapted to receive a clock input signal FCLK from an external clock, a first buffer that provides the clock signal VCLK to the clock input terminal 610, as well as a second buffer that provides a clock signal to the circuit 608. In one implementation, the electronic device 601, the clock signal source and the circuit 608 are soldered to a printed circuit board that provides traces or other electrically conductive connections from the output terminal 606 to an analog input terminal of the circuit 608, and connections from the clock input terminal 610 to the clock signal source. In another implementation, an electronic device includes the track and hold circuit 600, the clock signal source and the circuit 608 in a single integrated circuit, for example, a microcontroller with an included processor operating as the clock signal source and the circuit 608 that converts the sampled voltage output signal VS and provides digital conversion values to the processor. In these examples, moreover, the clock signal source generates the clock signal VCLK for operation of the track and hold circuit 600.

The track and hold circuit 600 includes a transistor 612 for sampling an analog voltage signal VIB according to the clock signal VCLK. The transistor 612 in this implementation is an n-channel field effect transistor (FET) that includes a source 613, a drain 614, and a gate 615. The transistor drain 614 is coupled to the output terminal 606. The track and hold circuit 600 also includes a capacitor 616 with a first terminal coupled to the output terminal 606 and a second terminal coupled to the reference terminal 604. In one example, the example track and hold circuit 600 includes a buffer (not shown) with a buffer input coupled to the input terminal 602 to receive the input voltage signal VIN, and a buffer output that provides a buffered input voltage signal VIB at a signal input terminal 619. In the illustrated example, the transistor source 613 is coupled to the signal input terminal 619, and the drain 614 is coupled to the output terminal 606. When the transistor 612 is turned on to sample the buffered input voltage signal VIB, the transistor 612 forms a connection to pass the signal VIB to the capacitor 616, which provides the sampled output voltage signal VS to the circuit 608. In another example, the buffer is omitted and the signal input terminal 619 is coupled directly to the input terminal 602.

The track and hold circuit 600 also includes a primary-side bootstrap circuit with a transformer 620 and wave shaping circuitry. The transformer 620 has a primary winding 621 with a first end 622 and a second end 623, as well as a secondary winding 624 with a first end 625 and a second end 626. The primary winding 621 in this example also includes a tap 627 between the first end 622 and the second end 623. In one example, the tap 627 is a center tap. In another example, the tap 627 is not at the center of the primary winding 621. The tap 627 is coupled to a supply voltage signal VDD. In one example, the supply voltage signal VDD is adjustable by a user.

The track and hold circuit 600 in this example includes a voltage source 628 having a first terminal (e.g., labeled "+" in FIG. 6) and a second terminal (e.g., labeled "−"). The first terminal of the voltage source 628 is coupled to the first end 625 of the secondary winding 624. The second terminal of the voltage source is coupled to the signal input terminal 619. The first end 625 of the secondary winding 624 is coupled to the first terminal of the voltage source 628, and the second end 626 of the secondary winding 624 is coupled to the gate 615. In operation, the first terminal of the voltage source 628 provides a DC bias voltage VDC to the secondary winding to facilitate controlled application of the gate-source voltage VGS to the transistor 612 in alternating first and second states above and below the threshold voltage of the transistor 612 for controlled actuation (e.g., turning on and turning off) of the transistor 612.

The primary winding 621 is coupled indirectly to the clock input terminal 610 and is indirectly coupled to the reference terminal 604. The track and hold circuit 600 includes an inverter 640, a first transistor 650, a second transistor 652, a first delay circuit 654, a third transistor 660, a fourth transistor 662, and a second delay circuit 664. The inverter 640 includes an inverter input 641 coupled to the clock input terminal 610, and an inverter output 642. The first transistor 650 includes a first source coupled to a reference terminal 604, a first drain coupled to the first end 622 of the primary winding 621, and a first gate coupled to the clock input terminal 610. The second transistor 652 includes a second source coupled to the reference terminal 604, a second drain coupled to the first end 622 of the primary winding 621, and a second gate. The first delay circuit 654 includes a first delay input coupled to the clock input terminal 610, and a first delay output coupled to the second gate. In the illustrated example, the transistor drain 614 and the first terminal of the capacitor 616 are coupled together to form a track and hold signal output 630 coupled to the output terminal 606. In addition, the second end 623 of the transformer primary winding 621 forms a clock input 632 coupled to the clock input terminal 610.

The third transistor 660 in FIG. 6 includes a third source coupled to the reference terminal 604, a third drain coupled to the second end 623 of the primary winding 621, and a third gate coupled to the inverter output 642. The fourth transistor 662 includes a fourth source coupled to the reference terminal 604, a fourth drain coupled to the second end 623 of the primary winding 621, and a fourth gate. The second delay circuit 664 includes a second delay input coupled to the inverter output 642, and a second delay output coupled to the fourth gate. In the illustrated example, the track and hold circuit 600 also includes first and second slew rate control circuits 656 and 666 coupled between the respective delay circuits 654 and 664 and the second and fourth gates. The first slew rate control circuit 656 includes an input coupled to an output of the first delay circuit 654, and an output coupled to the second gate. The second slew rate control circuit 666 includes an input coupled to an output of the second delay circuit 664, and an output coupled to the fourth gate. In another implementation, the slew rate control circuits 656 and 666 are omitted, the first delay output is coupled directly to the second gate, and the second delay output is directly coupled to the fourth gate.

FIG. 7 shows example clock signals, inverted clock signals, and delayed clock signals in the track and hold circuit of FIG. 6. A graph 700 in FIG. 7 includes a curve 701 that shows the clock signal VCLK is received at the clock input terminal 610. The clock signal VC okay is provided to the input 641 of the inverter 640, to the first gate of the first transistor 650, and to the input of the first delay circuit 654. The graph 700 also includes a curve 702 that shows a first delayed clock signal VCLKD provided to the second gate of the second transistor 652 from the first delay circuit 654, directly or through any included first slew rate circuit 656. As shown in FIG. 7, the clock signal VCLK has a period equal to the inverse of the clock frequency (e.g., 1/FCLK). In addition, the delay circuit 654 provides a non-zero skew or delay time 703 between the rising edges of the clock signal VCLK and the initial ramp rises in the delayed clock signal VCLKD. In this example, the curve 702 illustrates the delayed clock signal VCLKD for the case where the slew rate circuit 656 is used, which provides slew rate control to slow down the transitions or edges, such that the delayed clock signal VCLKD has upward and downward ramps, whereas the original clock signal VCLK has faster transitions and generally short duration edges.

A curve 711 in FIG. 7 shows an inverted clock signal VCLKB at the output 642 of the inverter 640, which is provided to the third gate of the third transistor 660, and to the input of the second delay circuit 664. The graph 700 further includes a curve 712 that shows a delayed inverted clock signal VCLKBD provided to the second gate of the second transistor 662 from the output of the second delay circuit 664, either directly or through any included second slew rate circuit 666. As seen in the curve 711 and 712, the inverted clock signals have the same clock frequency FCLK as the non-inverted clock signals of the curve 701 and 702. In addition, the second delay circuit 664 provides a non-zero skew or delay time 713 between the rising edges of the inverted clock signal VCLKB and the initial ramp rises in the delayed inverted clock signal VCLKDB. In this example, the curve 712 illustrates the delayed clock signal VCLKD for the case where the slew rate circuit 666 is used, which provides slew rate control to slow down the transitions or edges, such that the delayed inverted clock signal VCLKDB has upward and downward ramps, whereas the inverted clock signal VCLKB has faster transitions and generally short duration edges.

Figure 9:
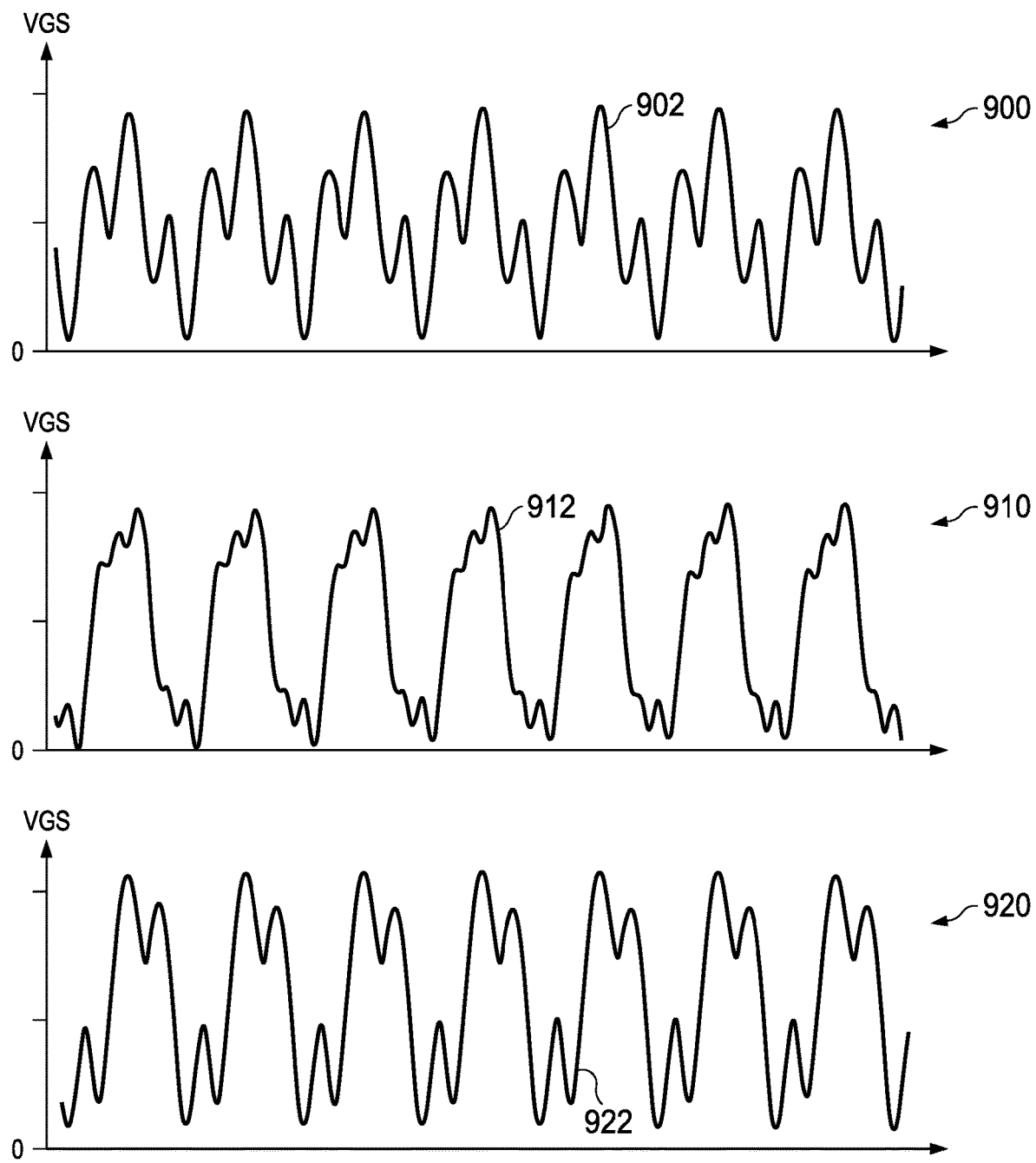
FIG. 9 is a graph of example gate-source voltage signals for different clock signal skew amounts in the track and hold circuit of FIG. 6.

As further shown in FIGS. 8 and 9, the primary-side wave shaping circuitry in the track and hold circuit 600 of FIG. 6 uses wave shaping to smooth out the primary side signal, leading to improved SFDR and reduced distortion in the sampling by the ADC 608. A graph 800 and FIG. 8 includes a curve 802 that shows SFDR as a function of clock signal skew amount (e.g., the delays 703 and 713 in FIG. 7. As seen in the graph 800, curve 804 exhibits a local maxima at which the SFDR is highest, and the delay circuits 654 and 664 can be tuned to provide delay values 703 and 713 that provide the best SFDR for a given track and hold circuit design. FIG. 9 includes a graph 900 showing one example gate-source voltage curve 902 for a first value of the skew amount 703 and 713 in the track and hold circuit 600. A graph 910 shows a second example gate-source voltage curve 912 for a second, higher skew amount 703 and 713, by which the gate-source voltage signal VGS is shaped to be more rectangular. A graph 920 in FIG. 9 shows a curve 922 that provides an even higher skew amount 703 and 713, resulting in further improvements in the rectangular nature of the gate-source voltage signal VGS.

Figure 10:
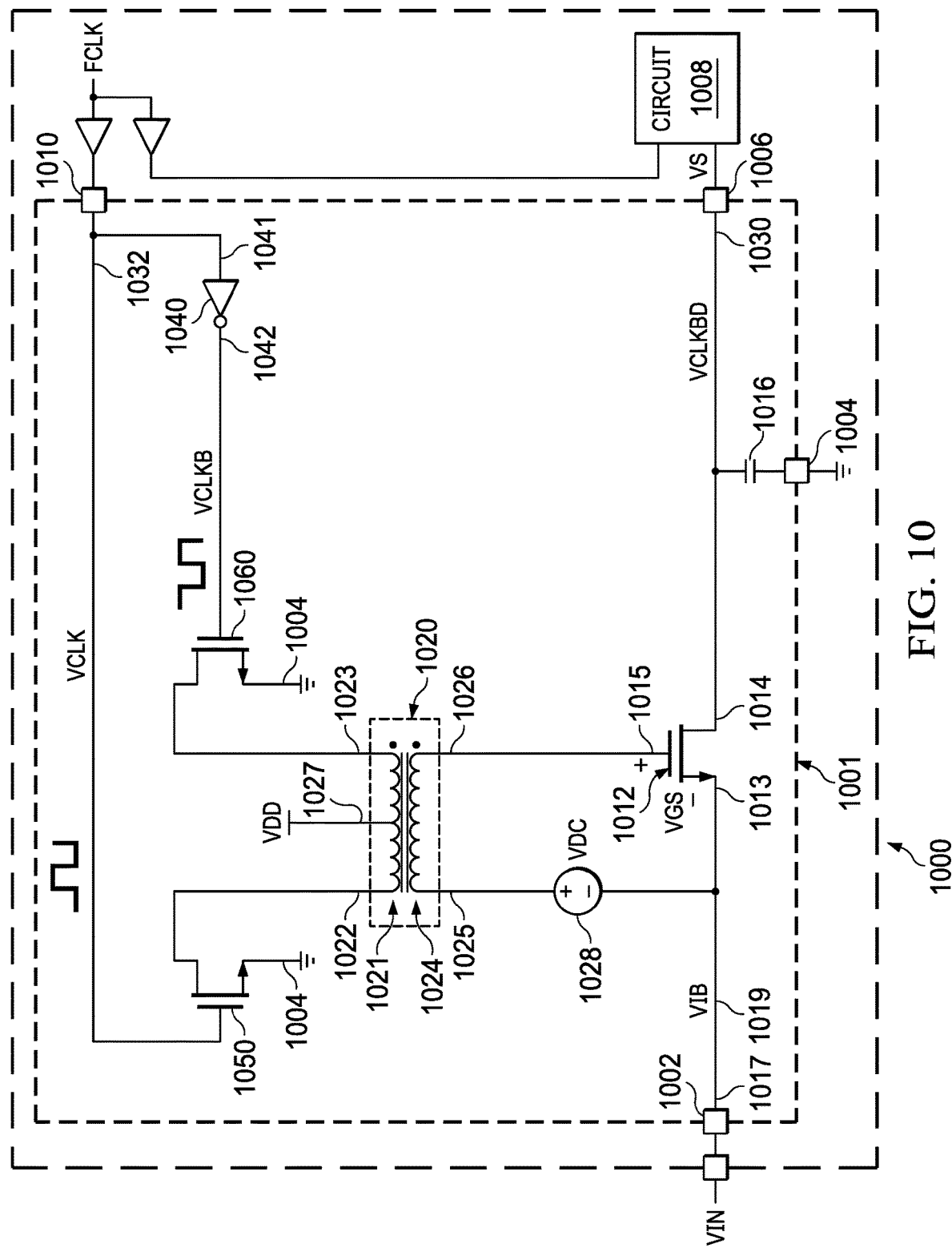
FIG. 10 is a schematic diagram of another example track and hold circuit having a bootstrap circuit with a transformer.

FIG. 10 shows another example track and hold circuit 1000 having a bootstrap circuit with a transformer. The track and hold circuit 1000 in one example is included in an electronic device 1001, such as an integrated circuit, which may, but need not, include other circuitry. The track and hold circuit 1000 includes an input terminal 1002 adapted to be coupled to receive a voltage input signal VIN, a reference terminal 1004 adapted to be coupled to a ground or other reference voltage node, an output terminal 1006 that provides a sampled voltage output signal VS a circuit 1008, and a clock input terminal 1010 adapted to be coupled to receive a clock signal VCLK from a processor or other clock signal source. In one example, the clock signal source includes an input adapted to receive a clock input signal FCLK from an external clock, a first buffer that provides the clock signal VCLK to the clock input terminal 1010, as well as a second buffer that provides a clock signal to the circuit 1008. In one implementation, the electronic device 1001, the clock signal source and the circuit 1008 are soldered to a printed circuit board that provides traces or other electrically conductive connections from the output terminal 1006 to an analog input terminal of the circuit 1008, and connections from the clock input terminal 1010 to the clock signal source. In another implementation, an electronic device includes the track and hold circuit 1000, the clock signal source and the circuit 1008 in a single integrated circuit, for example, a microcontroller with an included processor operating as the clock signal source and the circuit 1008 that converts the sampled voltage output signal VS and provides digital conversion values to the processor. In these examples, moreover, the clock signal source generates the clock signal VCLK for operation of the track and hold circuit 1000.

The track and hold circuit 1000 includes a transistor 1012 for sampling an analog voltage signal VIB according to the clock signal VCLK. The transistor 1012 in this implementation is an n-channel field effect transistor (FET) that includes a source 1013, a drain 1014, and a gate 1015. The transistor drain 1014 is coupled to the output terminal 1006. The track and hold circuit 1000 also includes a capacitor 1016 with a first terminal coupled to the output terminal 1006 and a second terminal coupled to the reference terminal 1004. In one example, the example track and hold circuit 1000 includes a buffer (not shown) with a buffer input coupled to the input terminal 1002 to receive the input voltage signal VIN, and a buffer output that provides a buffered input voltage signal VIB at a signal input terminal 1019. In the illustrated example, the transistor source 1013 is coupled to the signal input terminal 1019, and the drain 1014 is coupled to the output terminal 1006. When the transistor 1012 is turned on to sample the buffered input voltage signal VIB, the transistor 1012 forms a connection to pass the signal VIB to the capacitor 1016, which provides the sampled output voltage signal VS to the circuit 1008. In another example, the buffer is omitted and the signal input terminal 1019 is coupled directly to the input terminal 1002.

The track and hold circuit 1000 also includes a primary-side bootstrap circuit with a transformer 1020 and wave shaping circuitry. The transformer 1020 has a primary winding 1021 with a first end 1022 and a second end 1023, as well as a secondary winding 1024 with a first end 1025 and a second end 1026. The primary winding 1021 in this example also includes a tap 1027 between the first end 1022 and the second end 1023. In one example, the tap 1027 is a center tap. In another example, the tap 1027 is not at the center of the primary winding 1021. The tap 1027 is coupled to a supply voltage signal VDD. In one example, the supply voltage signal VDD is adjustable by a user. The track and hold circuit 1000 in this example includes a voltage source 1028 having a first terminal (e.g., labeled "+" in FIG. 10) and a second terminal (e.g., labeled "−"). The first terminal of the voltage source 1028 is coupled to the first end 1025 of the secondary winding 1024. The second terminal of the voltage source is coupled to the signal input terminal 1019. The first end 1025 of the secondary winding 1024 is coupled to the first terminal of the voltage source 1028, and the second end 1026 of the secondary winding 1024 is coupled to the gate 1015. In operation, the first terminal of the voltage source 1028 provides a DC bias voltage VDC to the secondary winding to facilitate controlled application of the gate-source voltage VGS to the transistor 1012 in alternating first and second states above and below the threshold voltage of the transistor 1012 for controlled actuation (e.g., turning on and turning off) of the transistor 1012. In the illustrated example, the transistor drain 1014 and the first terminal of the capacitor 1016 are coupled together to form a track and hold signal output 1030 coupled to the output terminal 1006. In addition, the second end 1023 of the transformer primary winding 1021 forms a clock input 1032 coupled to the clock input terminal 1010.

The primary winding 1021 is coupled indirectly to the clock input terminal 1010 and is indirectly coupled to the reference terminal 1004. The track and hold circuit 1000 includes an inverter 1040, a first transistor 1050, and a second transistor 1060. The inverter 1040 includes an inverter input 1041 coupled to the clock input terminal 1010, and an inverter output 1042. The first transistor 1050 includes a first source coupled to a reference terminal 1004, a first drain coupled to the first end 1022 of the primary winding 1021, and a first gate coupled to the clock input terminal 1010. The second transistor 1060 in FIG. 10 includes a second source coupled to the reference terminal 1004, a second drain coupled to the second end 1023 of the primary winding 1021, and a second gate coupled to the inverter output 1042.

The described examples use one or more transformers to couple the input clock signal VCLK to the sampling transistor of the track and hold circuit, by which advanced high-frequency scalable bootstrap operation is achieved with minimal impact on circuit efficiency, and without significant increase in circuit area. The described examples provide enhancements in terms of low distortion and improved SFDR, particularly in the third and fourth Nyquist zones at high frequencies, and thereby provide a cost-effective solution in analog-to-digital conversion and other applications where high-frequency track and hold circuitry is useful.

Modifications are possible in the described embodiments, and other embodiments are possible, within the scope of the claims.

What is claimed is:

1. A track and hold circuit, comprising:
   a signal input terminal;
   a clock input terminal;
   an output terminal;
   a transistor having a source, a drain and a gate, the source coupled to the signal input terminal, and the drain coupled to the output terminal; and
   a transformer having a primary winding and a secondary winding, the primary winding coupled to the clock input terminal, and the secondary winding coupled between the source and the gate.

2. The track and hold circuit of claim 1, further comprising a first voltage source terminal and a second voltage source terminal, the second voltage source terminal coupled to the signal input terminal;
   wherein the secondary winding comprises a first end and a second end, the first end of the secondary winding coupled to the first voltage source terminal, and the second end of the secondary winding coupled to the gate.

3. The track and hold circuit of claim 2, wherein the primary winding comprises a first end, a second end and a tap between the first and second ends, the tap coupled to a supply voltage terminal.

4. The track and hold circuit of claim 1, wherein:
   the primary winding comprises: a first end coupled to a reference terminal; and a second end coupled to the clock input terminal; and
   the secondary winding comprises: a first end coupled to the signal input terminal; and a second end coupled to the gate.

5. The track and hold circuit of claim 4, further comprising: a capacitor having a first terminal coupled to the output terminal; and a second terminal coupled to the reference terminal.

6. The track and hold circuit of claim 1, wherein the transformer is a first transformer, the primary winding is a first primary winding, the secondary winding is a first secondary winding, and the track and hold circuit further comprises:
   a second transformer having a second primary winding and a second secondary winding, the second primary winding coupled between a reference terminal and the clock input terminal, and the second secondary winding coupled in series with the first secondary winding between the source and the gate;
   a first capacitor coupled in parallel with the first primary winding between the reference terminal and the clock input terminal to form a first resonant circuit having a first resonant frequency; and
   a second capacitor coupled in parallel with the second primary winding between the reference terminal and the clock input terminal to form a second resonant circuit having a second resonant frequency that is different from the first resonant frequency.

7. The track and hold circuit of claim 6, wherein the first resonant frequency is a frequency of a clock signal at the clock input terminal, and the second resonant frequency is an odd harmonic of the first resonant frequency.

8. The track and hold circuit of claim 1, wherein the primary winding comprises: a first end coupled to a reference terminal; and a second end coupled to the clock input terminal.

9. The track and hold circuit of claim 1, further comprising an inverter, a first transistor, a second transistor, a first delay circuit, a third transistor, a fourth transistor and a second delay circuit;
   the inverter having an inverter input and an inverter output, the inverter input coupled to the clock input terminal;
   the first transistor having a first source coupled to a reference terminal, a first drain coupled to a first end of the primary winding, and a first gate coupled to the clock input terminal;
   the second transistor having a second source coupled to the reference terminal, a second drain coupled to the first end of the primary winding, and a second gate;
   the first delay circuit having a first delay input and a first delay output, the first delay input coupled to the clock input terminal, and the first delay output coupled to the second gate;
   the third transistor having a third source coupled to the reference terminal, a third drain coupled to a second end of the primary winding, and a third gate coupled to the inverter output;
   the fourth transistor having a fourth source coupled to the reference terminal, a fourth drain coupled to the second end of the primary winding, and a fourth gate; and
   the second delay circuit having a second delay input and a second delay output, the second delay input coupled to the inverter output, and the second delay output coupled to the fourth gate.

10. The track and hold circuit of claim 9, further comprising:
    a first slew rate control circuit having: an input coupled to an output of the first delay circuit; and an output coupled to the second gate; and
    a second slew rate control circuit having: an input coupled to an output of the second delay circuit; and an output coupled to the fourth gate.

11. The track and hold circuit of claim 1, further comprising an inverter, a first transistor and a second transistor;
    the inverter having an inverter input and an inverter output, the inverter input coupled to the clock input terminal;
    the first transistor having a first source coupled to a reference terminal, a first drain coupled to a first end of the primary winding, and a first gate coupled to the clock input terminal; and
    the second transistor having a second source coupled to the reference terminal, a second drain coupled to a second end of the primary winding, and a second gate coupled to the inverter output.

12. A bootstrap circuit to control a gate-source voltage of a sampling transistor of a track and hold circuit, the bootstrap circuit comprising:

a transformer having a primary winding and a secondary winding;

the primary winding comprising a first end and a second end;

the second end of the primary winding coupled to a clock input terminal;

the secondary winding comprising a first end and a second end;

the first end of the secondary winding adapted to be coupled to a source of the sampling transistor; and the second end of the secondary winding adapted to be coupled to a gate of the sampling transistor.

13. The bootstrap circuit of claim 12, further comprising a bias voltage source output;

wherein the primary winding comprises a tap between the first and second ends of the primary winding, the tap coupled to the bias voltage source output.

14. The bootstrap circuit of claim 13, wherein the first end of the primary winding is coupled to a reference terminal.

15. The bootstrap circuit of claim 12, further comprising an inverter, a first transistor, a second transistor, a first delay circuit, a third transistor, a fourth transistor, and a second delay circuit;

the inverter having an inverter input and an inverter output, the inverter input coupled to the clock input terminal;

the first transistor having a first source coupled to a reference terminal, a first drain coupled to the first end of the primary winding, and a first gate coupled to the clock input terminal;

the second transistor having a second source coupled to the reference terminal, a second drain coupled to the first end of the primary winding, and a second gate;

the first delay circuit having a first delay input and a first delay output, the first delay input coupled to the clock input terminal, and the first delay output coupled to the second gate;

the third transistor having a third source coupled to the reference terminal, a third drain coupled to a second end of the primary winding, and a third gate coupled to the inverter output;

the fourth transistor having a fourth source coupled to the reference terminal, a fourth drain coupled to the second end of the primary winding, and a fourth gate; and the second delay circuit having a second delay input and a second delay output, the second delay input coupled to the inverter output, and the second delay output coupled to the fourth gate.

16. The bootstrap circuit of claim 12, wherein the transformer is a first transformer, the primary winding is a first primary winding, the secondary winding is a first secondary winding, and the bootstrap circuit further comprises:

a second transformer having a second primary winding and a second secondary winding, the second primary winding coupled between a reference terminal and the clock input terminal, and the second secondary winding coupled in series with the first secondary winding between the source and the gate of the sampling transistor;

a first capacitor coupled in parallel with the first primary winding between the reference terminal and the clock input terminal to form a first resonant circuit having a first resonant frequency; and a second capacitor coupled in parallel with the second primary winding between the reference terminal and the clock input terminal to form a second resonant circuit having a second resonant frequency that is different from the first resonant frequency.

17. The bootstrap circuit of claim 16, wherein the first resonant frequency is a frequency of a clock signal at the clock input terminal, and the second resonant frequency is an odd harmonic of the first resonant frequency.

18. An electronic device, comprising:

a voltage input terminal;

a clock input terminal;

an output terminal;

a buffer having a buffer input and a buffer output, the buffer input coupled to the voltage input terminal;

a track and hold circuit having a signal input terminal, a transistor and a transformer;

the signal input terminal coupled to the buffer output;

the transistor having a source, a drain and a gate, the source coupled to the signal input terminal, and the drain coupled to the output terminal; and the transformer having a primary winding and a secondary winding, the primary winding coupled to the clock input terminal, and the secondary winding coupled between the source and the gate.

19. The electronic device of claim 18, wherein: the buffer comprises a buffer transistor and a current source; the buffer transistor has a source coupled to the signal input terminal, a drain coupled to a supply voltage terminal, and a gate coupled to the voltage input terminal; and the current source is coupled between the signal input terminal and a reference terminal.

20. The electronic device of claim 18, wherein the primary winding comprises: a first end coupled to a reference terminal; and a second end coupled to the clock input terminal.

* * * * *